United States Patent
Evans et al.

(10) Patent No.: US 6,963,129 B1
(45) Date of Patent: Nov. 8, 2005

(54) MULTI-CHIP PACKAGE HAVING A CONTIGUOUS HEAT SPREADER ASSEMBLY

(75) Inventors: Thomas Evans, LaPorte, CO (US);
Stan Mihelcic, Pleasanton, CA (US);
Leah M. Miller, Fremont, CA (US);
Kumar Nagarajan, San Jose, CA (US);
Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/464,178

(22) Filed: Jun. 18, 2003

(51) Int. Cl.$^7$ .......................... H01L 23/10; H01L 23/34
(52) U.S. Cl. ...................................... 257/706; 257/707
(58) Field of Search ................................ 257/723, 706, 257/707

(56) References Cited

U.S. PATENT DOCUMENTS

| | | | |
|---|---|---|---|
| 5,723,369 A | 3/1998 | Barber | |
| 5,777,383 A | 7/1998 | Stager et al. | |
| 5,790,384 A | 8/1998 | Ahmad et al. | |
| 5,956,576 A * | 9/1999 | Toy et al. | 438/125 |
| 6,008,536 A | 12/1999 | Mertol | |
| 6,111,313 A | 8/2000 | Kutlu | |
| 6,411,507 B1 * | 6/2002 | Akram | 361/690 |
| 6,680,532 B1 * | 1/2004 | Miller et al. | 257/723 |

* cited by examiner

Primary Examiner—Phat X. Cao
(74) Attorney, Agent, or Firm—Daffer McDaniel, LLP

(57) ABSTRACT

A system and method are provided for forming a multi-chip package. The multi-chip package includes a multi-layer substrate and a heat spreader of single, unibody construction. At least two integrated circuits are coupled between the multi-layer substrate and the heat spreader. The integrated circuits are spaced from one another to allow airflow between those circuits and a portion of the underside surface of the heat spreader. Depending on the layout of the package, a passive device can also be placed in the space between integrated circuits. The passive device extends upward a spaced distance from the underneath surface of the heat spreader so as not to block the airflow therebetween. The multi-chip package can accommodate integrated circuits that are either all packaged, all unpackaged, or a combination of each. If packaged and unpackaged integrated circuits are placed on the multi-layer substrate, the heat spreader can extend in two separate planes to accommodate the different thicknesses of those packaged and unpackaged integrated circuits. Alternatively, a second heat spreader can be placed on a relatively thin integrated circuit so that the upper surface of the second heat spreader is coplanar with an upper surface of a relatively thick integrated circuit. This will allow a planar heat spreader to be arranged across the thick integrated circuit and the second heat spreader. In all instances, however, the heat spreader extends as a single, contiguous unibody element across the entire multi-chip package.

6 Claims, 2 Drawing Sheets

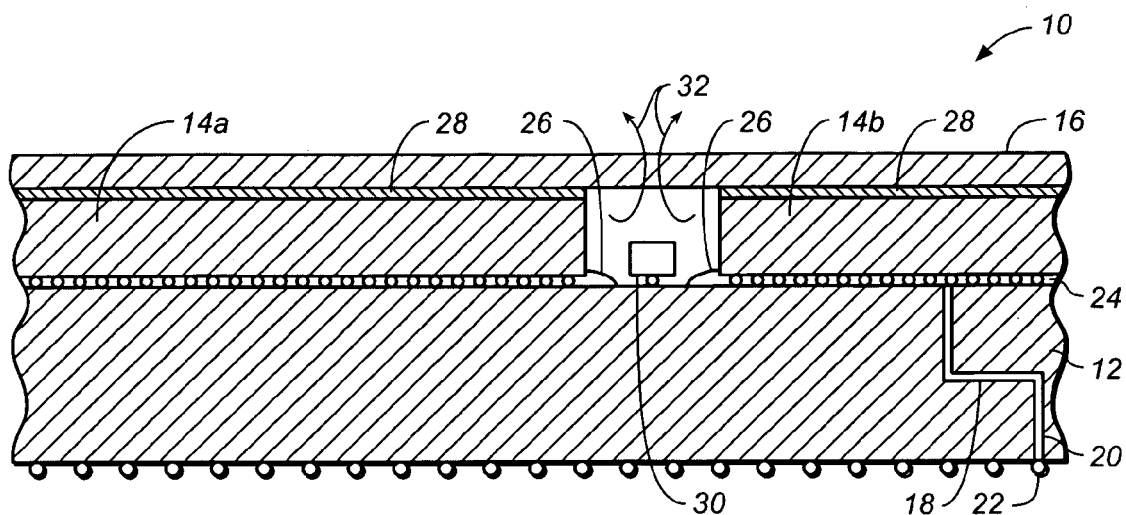
FIG._1
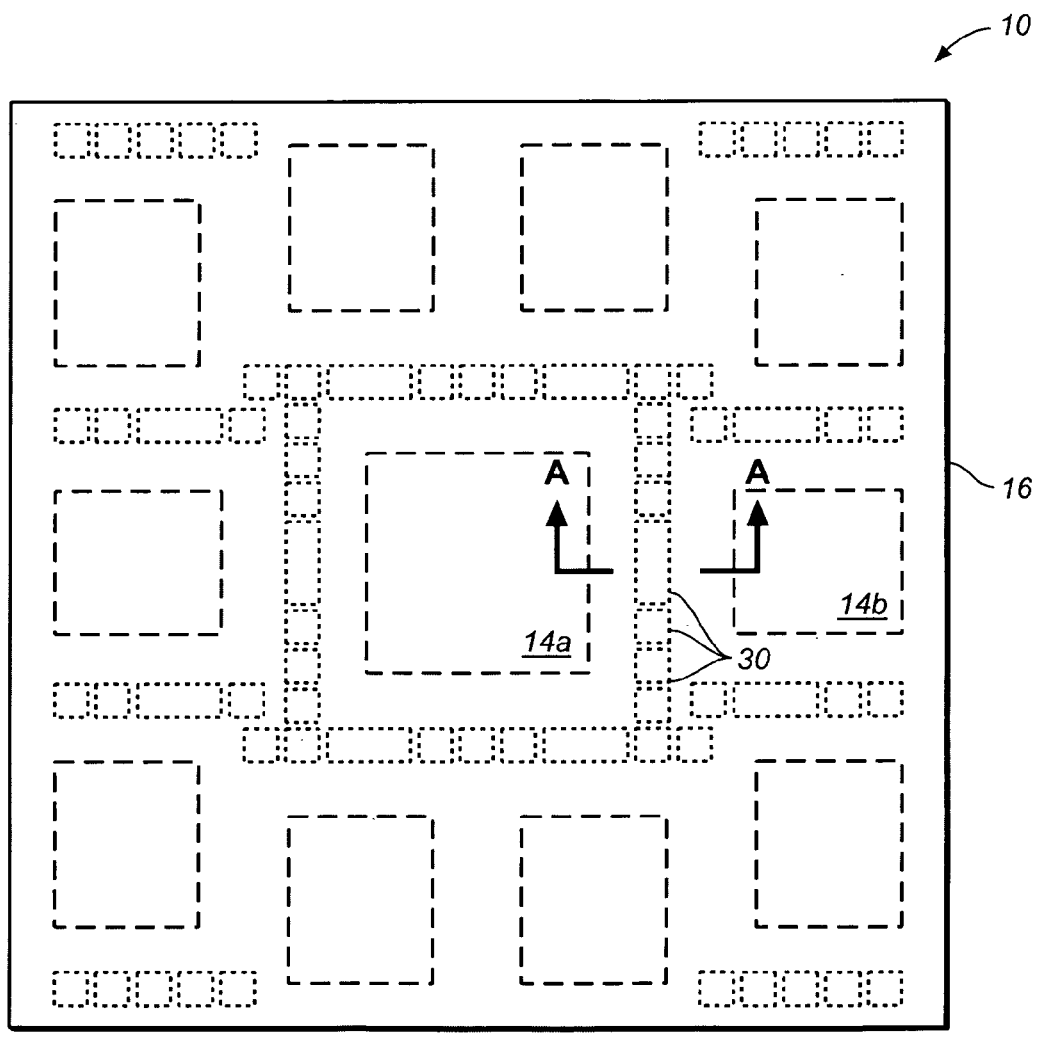
FIG._2

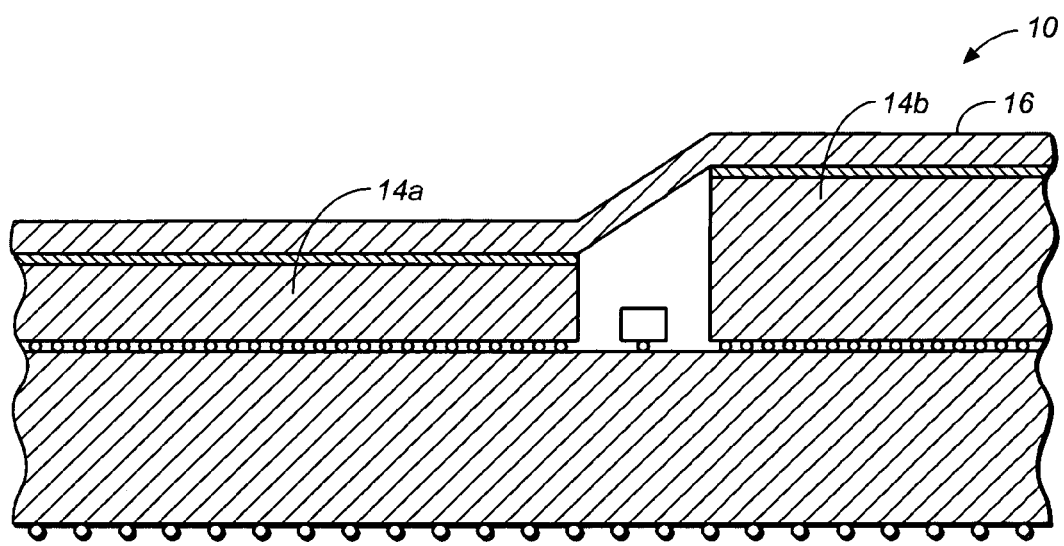
FIG._3
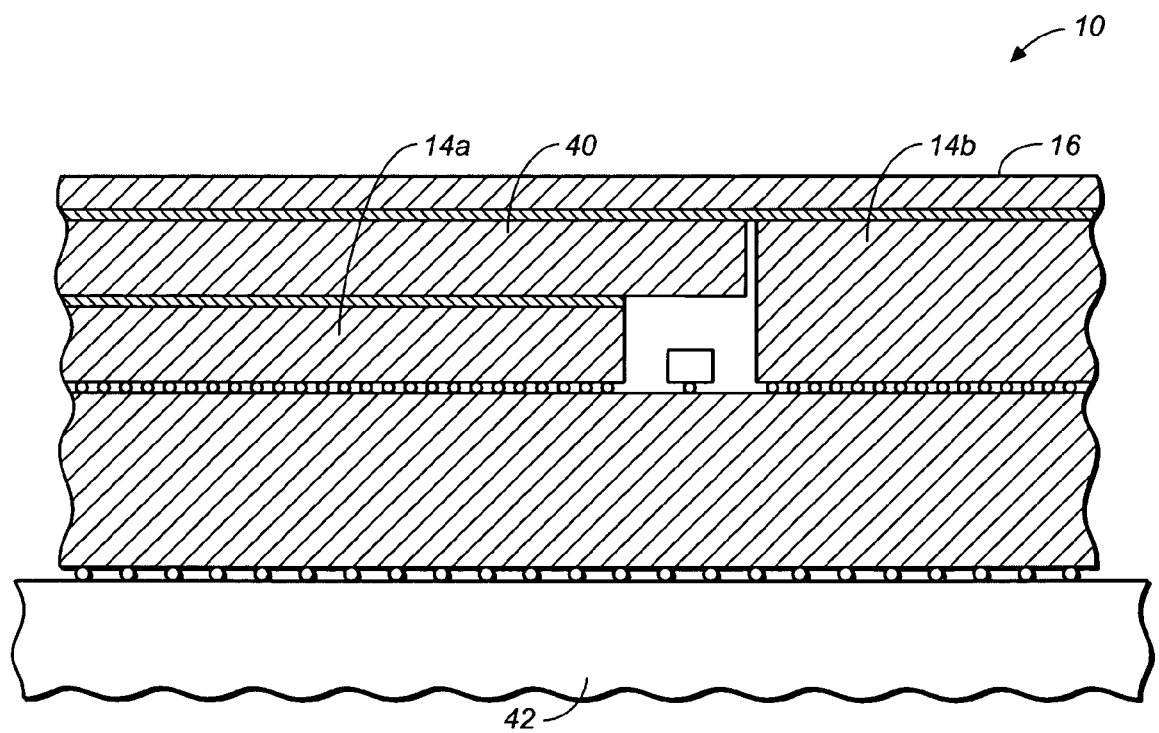
FIG._4

MULTI-CHIP PACKAGE HAVING A CONTIGUOUS HEAT SPREADER ASSEMBLY

BACKGROUND OF THE INVENTION

1. Field of Invention

This invention relates to integrated circuit packaging and, more particularly, to multiple integrated circuits secured to a substrate and having a heat spreader thermally coupled to a surface of each of the integrated circuits opposite the surface to which the substrate is secured.

2. Description of Related Art

The following descriptions and examples are not admitted to be prior art by virtue of their inclusion within this section.

An integrated circuit is generally manufactured by processing a topography of a wafer. Multiple processing steps take place in order to form circuitry across the processed surface. Following manufacture, individual die or chips are drawn from the wafer by slicing the wafer along the scribe line between neighboring die.

Each integrated circuit (i.e., die or chip) includes a series of input/output bonding pads arranged on the upper surface of the integrated circuit. The bonding pads can be arranged about a periphery of the integrated circuit or, alternatively, the bonding pads can be arranged in an array across the integrated circuit. If the bonding pads are placed near the periphery, fine metal wire can be used to connect the pads of the integrated circuit to leads of a package. The package serves to hermetically seal the integrated circuit, with electrical connectivity between the integrated circuit bonding pads and external leads of the package.

If the bonding pads are arranged in an array, then the integrated circuit can be inverted or "flipped" such that the array of bonding pads are connected to a corresponding array of a package substrate. The technique of bonding an inverted chip to a package substrate is oftentimes referred to as "flip-chip," "C4," or "ball grid array" bonding. On a surface of the package substrate opposite the flip-chips may also be an array of bonding pads similar to leads of a package. The end result, regardless of whether fine metal wires are used to form the connection or flip-chip bonding is used, is to present a packaged integrated circuit having a series of leads or receptors that can extend from the package for connection to a printed circuit board (PCB).

In instances where high-density connection is not needed, a packaged integrated circuit using wire bonds and, for example, a lead frame may be adequate. The leads extending from the hermitically sealed package can then be inserted into the PCB or, alternatively, the leads can be surface mounted using various solder reflow techniques.

In instances where a higher density connection is needed, however, flip-chip mounting may be more adequate. The integrated circuits are inverted, with an array of bonding pads mounted to a multi-layer package substrate (hereinafter referred to as "substrate"). The substrate may have many layers and serves to spread the contact array from a first density at the die to a second, lower density, at the opposing surface of the substrate. In most instances, there is a 1:1 correspondence between the electrical contact at the die and corresponding electrical contact at the PCB. By using multiple signal trace conductors, power planes, and ground planes within the substrate, a high-density spreader function is achievable using modern substrates.

Conventional flip-chip bonding mechanisms generally involve a single integrated circuit bonded to a substrate surface, with most if not all of the integrated circuit encapsulated with a curable fill material. In many applications, however, it is desirable to place a first integrated circuit in relative close proximity to a second integrated circuit. For example, it would be of benefit to place a core logic device of an execution unit near memory so that the parasitics on signals sent therebetween is reduced. Packaging each integrated separately (whether by flip-chip or wire-bonding) and then placing the individual packaged integrated circuits on a printed circuit board not only increases the parasitics, but also requires higher drive currents, higher power dissipation, more routing congestion, and leads to a larger overall size. Alternatively, the memory circuit might be integrated onto the same integrated circuit that embodies the logic device, for example. This, however, would lead to a relatively high lead time and design complexity of that integrated circuit, and result in a larger overall integrated circuit size. As the size increases, the overall yield might decrease.

It would be desirable to implement a package assembly that would accommodate multiple integrated circuits in order to reduce the parasitics, power dissipation, routing congestion, and size. By using a desired multiple chip or die package, the development costs and larger die sizes of attempting to place all of the multiple chip functionality on a single integrated substrate would also be reduced. In addition to deriving a multi-chip package, the desired package would also have better thermal characteristics by using an improved heat transfer mechanism. Still further, the desired multi-chip package could employ a mix-and-match assembly philosophy, whereby packaged and unpackaged integrated circuits can be accommodated with optimal heat transfer from each.

SUMMARY OF THE INVENTION

The problems outlined above are in large part solved by a multi-chip module or package. Instead of flip-chip bonding a single integrated circuit to a substrate, or bonding a single integrated circuit through wires to a lead frame and thereafter packaging that circuit, multiple integrated circuits are packaged. One or all of the integrated circuit can be previously packaged before being bonded to a substrate. Alternatively, one or all of the integrated circuits can be unpackaged before being bonded to a substrate. If packaged, the packaged integrated circuit can be bonded to the substrate using, for example, surface mount techniques (SMTs). If unpackaged, the integrated circuit is flip-chip bonded to the substrate.

According to one embodiment, the integrated circuits within the multi-chip package may include a logic device and a memory. The logic device and memory are on separate integrated circuits. The logic device may be previously unpackaged and thereby mounted to the substrate using a flip-chip bonding mechanism. The memory can either be unpackaged or packaged before being bonded to the substrate. Preferably, the integrated circuits, regardless of whether they are memory and logic devices, are spaced from each other. The integrated circuits contain many transistors and are hereinafter referred to as "active devices." Also mounted to the substrate can be one or more passive devices, such as capacitors and resistors. The passive devices may serve to decouple noise from being placed onto the trace conductors within the substrate or at the bonding pad interface.

According to another embodiment, a space is purposely left between integrated circuits. The space is dimensioned in order to accommodate one or more passive devices. While underfill material can be inserted and thereafter cured only in the region around the bonding pad interfaces, the space between neighboring integrated circuits is purposely void of any dielectric material, such as injected molded material or non-injected molded material. If a passive device is contained within that space, then the passive device will, in most instances, have an upper elevation that is not coplanar with an upper elevation of a packaged or unpackaged integrated circuit. This disparity in elevation will accommodate a heat spreader to be placed on the exposed upper surfaces of the integrated circuits with a space left between the heat spreader and any underlying passive devices. The space beneficially allows greater thermal transfer at the underneath surface of the heat spreader between neighboring integrated circuits and above any passive devices within that space.

If the multi-chip package connotes both unpackaged and packaged integrated circuits, the packaged integrated circuit may be thicker than the unpackaged integrated circuit. The heat spreader may, therefore, extend in two planes onto the exposed upper surfaces of those integrated circuits. Alternatively, the thinner unpackaged integrated circuit may have a second heat spreader placed between the unpackaged integrated circuit and the heat spreader. The second heat spreader preferably has an upper surface that is coplanar with the upper surface of a packaged integrated circuit so that a single, planar heat spreader can extend across all upper surfaces without having to be deformed, bent, or curved in any way so as to form two planes.

By using a heat spreader and purposely applying an air-filled gap or space between neighboring integrated circuits, greater thermal transfer efficiency can be obtained. The operating temperature of the multi-chip package is, therefore, governed by the temperature of the ambient surrounding the package, the amount of electrical power dissipation by the package, and the sum of thermal resistances of the elements and interfaces along a heat transfer path from the various integrated circuits to the ambient. By maintaining an air gap between integrated circuits, without a higher thermal resistance element in the interim, the heat transfer path from the upper and sidewalls of each integrated circuit is substantially enhanced. Moreover, by maintaining, for example, the memory and logic integrated circuits in close proximity to one another, the amount of electrical drive needed to power each chip is reduced and, accordingly, the electrical power dissipation within the overall multi-chip package is minimized. Still further, by placing the memory integrated circuit within a package, and then bonding the package to the substrate along with unpackaged logic circuits, a defective memory can be readily removed and replaced without having to discard the entire multi-chip package, for example.

BRIEF DESCRIPTION OF THE DRAWINGS

Other objects and advantages of the invention will become apparent upon reading the following detailed description and upon reference to the accompanying drawings in which:

FIG. 1 is a cross-sectional view along plane A—A of FIG. 2, showing at least two integrated circuits coupled between a substantially planar heat spreader and a substrate;

FIG. 2 is a top plan view of multiple integrated circuits shown in phantom beneath a heat spreader and coupled to a substrate to form a multi-chip package;

FIG. 3 is a cross-sectional view along plane A—A of FIG. 2, showing an alternative embodiment wherein the heat spreader extends along two dissimilar planes to accommodate a relatively thin unpackaged integrated circuit and a relatively thick packaged integrated circuit; and FIG. 4 is a cross-sectional view along plane A—A of FIG. 2, showing yet another alternative embodiment wherein the heat spreader extends along a single plane upon a second heat spreader that extends over only the relatively thin unpackaged integrated circuits.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to FIG. 1, a portion of a multi-chip package 10 is shown along plane A—A of FIG. 2. Package 10 includes a multi-layer substrate 12, two or more integrated circuits 14 placed on substrate 12, and a heat spreader 16 placed on the integrated circuits 14. Substrate 12 preferably includes multiple layers of conductive elements separated by a dielectric material. The process steps in forming a multi-layer substrate 12 is generally well known. For example, the dielectric material may comprise multiple grades of epoxy resins supported on woven glass fabric. The material is often referred to as a fiberglass-epoxy material. Alternatively, the material can be made of ceramic (e.g., aluminum oxide, alumina, $Al_2O_3$, or aluminum nitride). Still further, the material can be made of organics, such as polymide or Teflon®. The epoxy materials or resins can be G-10 or FR-4 grades of epoxy resins, if desired.

The conductive layers can be made of any electrically conductive material. For example, the material can be electro-deposited copper or electro-less copper, alternatively. Other metals, rather than copper, can be used, such as aluminum, nickel and nickel-based alloys, stainless steel, or even silver. The conductive material can be additively placed, or placed and thereafter etched to form relatively narrow trace conductors on the signal planes. The power and ground planes can be an entire planar element, if desired.

Substrate 12 in FIG. 1 shows only one trace conductor 18 with vias 20 extending to and from trace conductor 18. It is understood that, for sake of brevity, only one trace conductor is shown, yet a multi-layer substrate 12 contains possibly hundreds if not thousands of trace conductors and corresponding vias.

Substrate 12 preferably has an array of bonding pads (or solder balls) 22 on a surface of the substrate opposite a surface on which integrated circuits 14 are placed. Solder balls 22 form one terminal end of a signal path through substrate 12. The other terminal end may be a bonding pad within an array of bonding pads (or solder bumps) 24. Solder bumps 24 on the upper surface of substrate 12 are in registry with another set of bonding pads on the lower surface of integrated circuits 14. Using thermal energy, the corresponding bonding pads will join to form a solder connection at the time in which those pads are brought in contact with one another. This process is generally referred to as the "reflow" process. Regardless of whether a flip-chip mounting technique or a surface mounting technique (SMT) is used, reflow will join the corresponding bonding pads and form an electrical connection between the trace conductors 18 of substrate 12 and corresponding circuits within integrated circuits 14.

In the example of FIG. 1, integrated circuits 14 are unpackaged and placed in a flip-chip bonding configuration for electrical connection to substrate 12. Thus, the processed side of the corresponding die is inverted and connected through bonding pads on that surface to corresponding bonding pads on substrate 12 using solder reflow. Once secured, a relatively small amount of underfill material 26 is applied around the joining bonding pads at the interface between integrated circuits 14 and substrate 12. Underfill 26 comprises any material which can be applied and subsequently cured, yet has a dielectric characteristic. Popular forms of underfill include an epoxy compound having suspended particles of thermally conductive and electrically insulated material, such as silica. A suitable epoxy compound can be obtained from Dextra Electronic Materials. Preferably, underfill material does not extend upward to cover the sidewall surfaces of integrated circuits 14. The purpose of underfill 26 is to reduce the disparate coefficient of thermal expansion between substrate 12 and integrated circuits 14. The underfill material can be applied using capillary action to fill the space between the underside of integrated circuits 14 and the upper surface of substrate 12 only in the vicinity of that juncture, purposely leaving sidewall surfaces of neighboring chips 14 exposed to air.

Placed on the upper surfaces of each integrated circuit 14 can be a layer of thermally conductive material 28. Material 28 can have some adhesive properties, and can be made of an epoxy compound that includes particles of, for example, silver, aluminum, boron nitride, etc. A suitable epoxy can be obtained from Abelstik Company. Alternatively, thermal interface layer 28 may be made of a thermal grease, thermal wax, or a piece of thermal interface tape. Depending on the type of adhesive properties needed, thermal interface layer 28 may be subjected to a curing process in order to form a strong bond between heat spreader 16 and integrated circuits 14.

Heat spreader 16 is formed from a thermally conductive material. Preferably, the material is a metal, such as aluminum or copper. Heat spreader 16 can be relatively thick to provide mechanical rigidity or, alternatively, relatively thin as a sheet of metal. According to one example, heat spreader 16 is approximately 0.6 mm+/−0.05 mm. If desired, the upper surface of heat spreader 16 can have grooves or ridges extending into or from that surface to enhance the transfer of thermal energy to the ambient. Thermal interface layer 28 should be made as thin as possible and, according to one example, is approximately 0.075 mm+/−0.025 mm.

Depending on the layout of the integrated circuits 14, there may be a passive device 30 placed in the space between neighboring integrated circuits. Terminal ends of passive device 30 are connected to corresponding solder bumps and respective trace conductors within substrate 12. Those trace conductors may extend over to bonding pads of an integrated circuit or, alternatively, extend to a solder ball at the lower surface of substrate 12. The bonding pads 22 on the lower surface of substrate 12 are reserved for connection to a PCB, such as a daughterboard or motherboard. Package 10, therefore, appears to a user as a package which can be picked from among a group of similarly functioning packages, and placed onto a printed circuit board to effectuate an electronic assembly.

Between neighboring integrated circuits 14 and above passive device 30 is a space through which air can circulate, as shown by arrows 32. The circulation of air across the underneath surface of heat spreader 16 between neighboring integrated circuits will thereby cool the sidewall surfaces of the integrated circuits. This will thereby enhance the thermal transfer efficiency by ensuring no fill material other than the minimal underfill material exists within the space between integrated circuits. Part and parcel of maintaining that space is the goal of layout. By purposely situating the chips relative to one another, not only can a memory chip 14b be placed close to a logic device 14a, but a space can be maintained therebetween. That space may accommodate a passive device 30, yet the upper surface of passive device 30 is spaced below the lower surface of heat spreader 16 to maintain airflow therebetween.

FIG. 2 illustrates a top plan view of the multi-chip package 10. As shown, there may be numerous integrated circuits 14 and numerous passive devices 30 bonded to a single substrate. Moreover, a single contiguous heat spreader 16 may be situated across the entire multi-chip package. The heat spreader thereby has periodic regions at the underside surface that are exposed to the transfer of air. Those regions comprise the space between neighboring integrated circuits. Integrated circuits 14 are shown in phantom to represent their configuration below an upper heat spreader element 16 that extends across the entire package 10.

FIGS. 3 and 4 illustrate alternative embodiments. Specifically, FIG. 3 shows a packaged integrated circuit 14b placed near an unpackaged integrated circuit 14a. Since integrated circuit 14b may be thicker than integrated circuit 14a, heat spreader 16 is deformed so that it extends in two planes. For example, when reviewing FIGS. 2 and 3 in combination, the logic circuit 14a may be relatively thin, with memory integrated circuit 14b placed around the logic circuit. If the memory circuits are packaged, then the heat spreader near the center of multi-chip package 10 is at a lower elevation than the heat spreader near the edges or periphery of package 10. Depending on the thickness of heat spreader 16, the effort needed to deform and maintain that deformity in two planes can be minimal. All other elements of FIG. 3 are similar to those in FIG. 1 and are not labeled for sake of brevity and clarity in the drawings.

FIG. 4 illustrates yet another embodiment whereby a relatively thin integrated circuit 14a is placed a spaced distance from a relatively thick (possibly packaged) integrated circuit 14b. Instead of deforming the heat spreader 16, a second heat spreader 40 may be used. Second heat spreader 40 can be of variable thickness and is preferably made of the same material as heat spreader 16. The thickness of second heat spreader 40 is adjusted to accommodate the difference in thickness between integrated circuits 14a and 14b. Preferably, second heat spreader 40 has a thickness equivalent to the difference between the thicknesses of integrated circuits 14a and 14b. Thus, the upper surface of second heat spreader 40 is coplanar with an upper surface of integrated circuit 14b. This ensures that heat spreader 16 extends along a single plane and can be readily secured to the planar surface made up of second heat spreader 40 and integrated circuit 14b.

FIG. 4 further illustrates the multi-chip package 10 secured to a printed circuit board 42. It is understood that the other embodiments showing multi-chip package 10 of FIGS. 1–3 can also be secured to a PCB 42. Similar to FIG. 3, the elements which are unchanged from FIG. 1 are not labeled for sake of brevity and clarity in the drawings.

Numerous variations and modifications will become apparent to those skilled in the art once the above disclosure is fully appreciated. It is intended that the following claims be interpreted to embrace all such variations and modifications.

What is claimed is:

1. A heat spreader assembly, comprising:
    a single, unibody heat spreader configured to extend across substantially the entire first surface of at least two spaced integrated circuits opposite a second surface of the integrated circuits having a bonding pad;
    adhesive placed between the heat spreader and the first surface for securing the heat spreader to the first surface of the integrated circuits at a spaced distance above at least one passive device arranged in the area between the spaced integrated circuits; and
    a second heat spreader interposed between the heat spreader and only of the at least two spaced integrated circuits.

2. The heat spreader assembly as recited in claim 1, wherein the heat spreader extends along a single plane.

3. The heat spreader assembly as recited in claim 1, wherein the beat spreader extends along two planes.

4. The heat spreader assembly as recited in claim 1, wherein an upper surface of the second heat spreader is coplanar with an upper surface of only one of the at least two spaced integrated circuits.

5. The heat spreader assembly as recited in claim 1, wherein the heat spreader is thermally conductive.

6. The heat spreader assembly as recited in claim 1, wherein the heat spreader comprises copper or other metal material.

* * * * *